US007042406B2

(12) United States Patent
McFarland et al.

(10) Patent No.: US 7,042,406 B2
(45) Date of Patent: May 9, 2006

(54) METHOD AND APPARATUS FOR INSURING INTEGRITY OF A CONNECTORIZED ANTENNA

(75) Inventors: William J. McFarland, Los Altos, CA (US); Michael R. Green, Natick, MA (US)

(73) Assignee: Atheros Communications, Inc., Santa Clara, CA (US)

( * ) Notice: Subject to any disclaimer, the term of this patent is extended or adjusted under 35 U.S.C. 154(b) by 6 days.

(21) Appl. No.: 10/671,850

(22) Filed: Sep. 25, 2003

(65) Prior Publication Data

US 2005/0174292 A1 Aug. 11, 2005

Related U.S. Application Data

(62) Division of application No. 10/007,808, filed on Dec. 3, 2001, now Pat. No. 6,853,197.

(51) Int. Cl.
*G01R 29/10* (2006.01)

(52) U.S. Cl. ........................................ 343/703; 343/906

(58) Field of Classification Search .......... 343/700 MS, 343/846, 702, 906, 703, 718, 894, 850; 324/549, 324/612

See application file for complete search history.

(56) References Cited

U.S. PATENT DOCUMENTS

| | | | | |
|---|---|---|---|---|
| 4,746,925 | A | 5/1988 | Toriyama | 343/713 |
| 4,827,266 | A * | 5/1989 | Sato et al. | 343/700 MS |
| 4,962,358 | A * | 10/1990 | Svetanoff | 324/627 |
| 4,972,196 | A * | 11/1990 | Mayes et al. | 343/700 MS |
| 5,134,418 | A * | 7/1992 | Gomez et al. | 343/718 |
| 6,018,324 | A | 1/2000 | Kitchener | 343/795 |
| 6,351,223 | B1 * | 2/2002 | DeWeerd et al. | 340/870.03 |
| 6,657,214 | B1 * | 12/2003 | Foegelle et al. | 250/506.1 |

FOREIGN PATENT DOCUMENTS

| | | | |
|---|---|---|---|
| EP | 1 134 853 | A | 9/2000 |
| JP | 59 023901 | A | 7/1982 |
| JP | 09 212446 | A | 8/1997 |
| JP | 2001 230831 | A | 8/2001 |
| JP | 2002 319907 | A | 10/2002 |
| WO | WO 0161502 | A | 8/2001 |

* cited by examiner

*Primary Examiner*—Hoang V. Nguyen
(74) *Attorney, Agent, or Firm*—Bever, Hoffman & Harms, LLP; Jeanette S. Harms

(57) ABSTRACT

An antenna is provided with an electronic component or circuit that has a value corresponding to properties of the antenna. A read mechanism reads the value and sets an operational status of a transceiver based on the value. In one embodiment, electronic component is a resistor having a value that identifies the antenna properties. A table may be used to correlate resistor values to different types of antennas or sets of antenna properties. Alternatively, the circuit can be embodied in a microchip that provides a response to a challenge sent by the read mechanism. The response encodes the properties of the antenna. The encoding scheme includes values from the challenge. Alternatively, the response is a code that is indexed into a table of antenna properties. In one embodiment, the antenna is connectorized.

32 Claims, 7 Drawing Sheets

Prior Art

METHOD AND APPARATUS FOR INSURING INTEGRITY OF A CONNECTORIZED ANTENNA

RELATED APPLICATIONS

This application is a divisional of U.S. application Ser. No. 10/007,808, now U.S. Pat. No. 6,853,197 filed Dec. 3, 2001.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates to communication devices, and more particularly to wireless devices. The present invention is also related to checking integrity of devices connected to wireless devices, and particularly to checking integrity and verification of proper antenna devices connected to wireless communication devices.

2. Discussion of Background

There are a number of reasons that manufacturers prefer to have antennas that are connectorized. This allows customers to choose among a variety of antennas, select the best one for a given situation, and attach them on their own. Connectorized antennas can also be more convenient for manufacturing. They also allow easy customization of products for a given regulatory domain. If antennas become broken, they can be replaced by the user. Testing of units in the field is easier if the antennas are attached with standard connectors.

However, there are a number of reasons that not any antenna should be attached. Some antennas would violate FCC rules due to excessive gain. Other antennas could damage the unit by being of the wrong impedance or frequency and reflecting power back to the transmitter. It is therefore desirable to have a method which insures that a device will operate only when antennas that are appropriate to that device are connected.

In the past, people have used "unique" antenna connectors to attempt to prevent users from connecting antennas that violate FCC rules or otherwise be inappropriate for use with the device. An example of such a unique antenna connector is a standard connector in which the threading has been reversed such that it will not mate with the traditional form of the connector. FIG. 1 illustrates another "unique" antenna connector, in a cell phone application, where an antenna 40 is connected to a cell phone 30, via an outer and inner connector 15/25. Note the unique features on inner connector 25 that must mate with corresponding surfaces in outer connector mate 15. However, such "unique" connectors are easy to duplicate and often become common place. Furthermore, the FCC has required UNII devices operating in the 5.15–5.25 GHz band to use "integral antennas," and, an easily duplicated "unique" connector is insufficient to insure integrity.

SUMMARY OF THE INVENTION

The present inventors have realized the need to verify antenna integrity, and particularly connectorized antennas, so it can be assured that characteristics of an antenna match other components (receiver, power, etc) of a communications system to which they are attached. The present invention verifies the integrity of an antenna not by a unique physical connector, but by a unique electrical property that can be hidden within the antenna itself. Depending on the sophistication of the integrity algorithm, it can be made very difficult or impossible for a user to attach an antenna that is not intended for use with the device. Further, it would be possible for the device to read information from the antenna such as the antennas gain. After reading the gain of the antenna, the device could automatically adjust its transmit power to insure FCC compliance.

In one embodiment, the present invention provides an antenna integrity check device, comprising, a measurement device configured to determine at least one value of an antenna, at least one electronic device connectable to the antenna, and a controller configured to prevent operation of the electronic device based on the determined antenna value.

In another embodiment, the invention is embodied as an antenna, comprising, an RF input pin, at least one antenna element connected to the RF input pin, and at least one electronic component connected to the RF input pin. Multiple pins in addition to the RF pin may be present, where at least one antenna element is connected to the RF input pin, and a series of shorts and opens connected to a set of said input pins.

The invention includes a method of checking integrity of an antenna, comprising the steps of, determining at least one property of the antenna, enabling an electronic device connected to the antenna if the antenna property is within a valid range. The invention also includes a method of manufacturing an antenna, comprising the steps of, preparing a substrate, disposing at least one antenna element on the substrate, attaching a connector to said at least one antenna element, inserting at least one electronic component on the substrate in a location where it is not easily removed or modified. To increase robustness, the antenna element may be disposed within the substrate.

Portions of the antenna, method, and associated devices may be conveniently implemented in programming on a general purpose computer, or networked computers, and the results may be displayed on an output device connected to any of the general purpose, networked computers, or transmitted to a remote device for output or display. In addition, any components of the present invention represented in a computer program, data sequences, and/or control signals may be embodied as an electronic signal broadcast (or transmitted) at any frequency in any medium including, but not limited to, wireless broadcasts, and transmissions over copper wire(s), fiber optic cable(s), and co-ax cable(s), etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present inventors have realized the need to provide connectorized antennas whose integrity can be verified as matching the other components of a communications system to which they are attached. As stated above, there are a number of reasons that manufacturers prefer to have antennas that are connectorized. Therefore, it would seem advantageous to make all antennas connectorized so that they can be easily mixed and matched for repairs, testing, experimentation, etc. However, because there are a number of reasons that not just any antenna should be allowed to be attached and operate with a given communications system, the present invention provides a device and method that insures that a given communication device will only operate when antennas that are appropriate for that device are connected.

In one embodiment, the present invention comprises a resistor having a specific value that identifies one or more property or characteristic of the antenna. The resistor is installed on the antenna and the value of the resistor is checked prior to operation of a communication device attached to the antenna. This approach is useful even in the case of a single pin antenna connector. While the AC signal comprising the transmission to be broadcast flows to the antenna, a DC signal flows through the resistor mounted from the signal pin to ground. The transmitter then senses the value of the resistor and checks that it is correct. The resistor value can also communicate the gain or other features or properties of the antenna.

Figure 1:
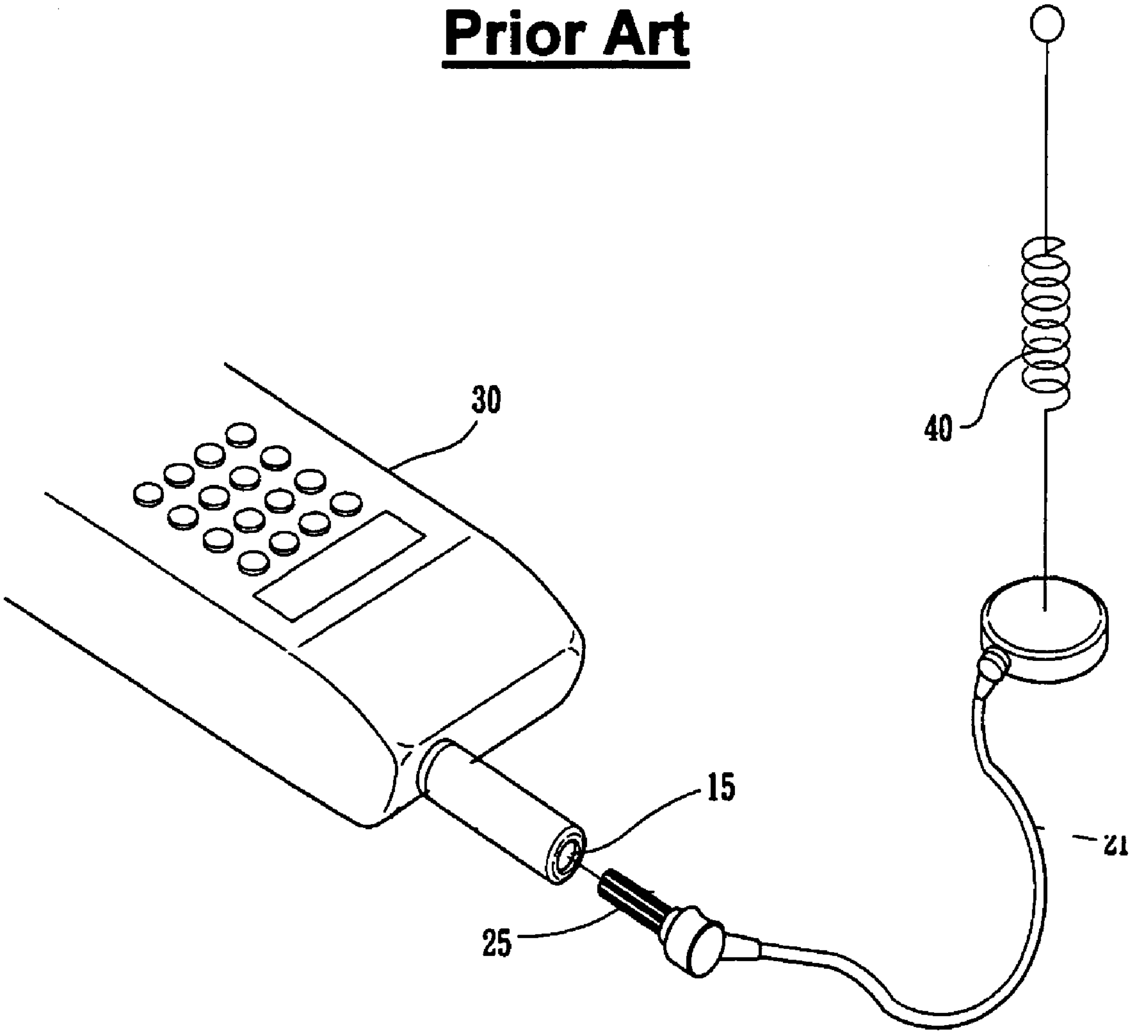
FIG. 1 is a prior art system for attaching a proper antenna to a wireless device.
Figure 2:
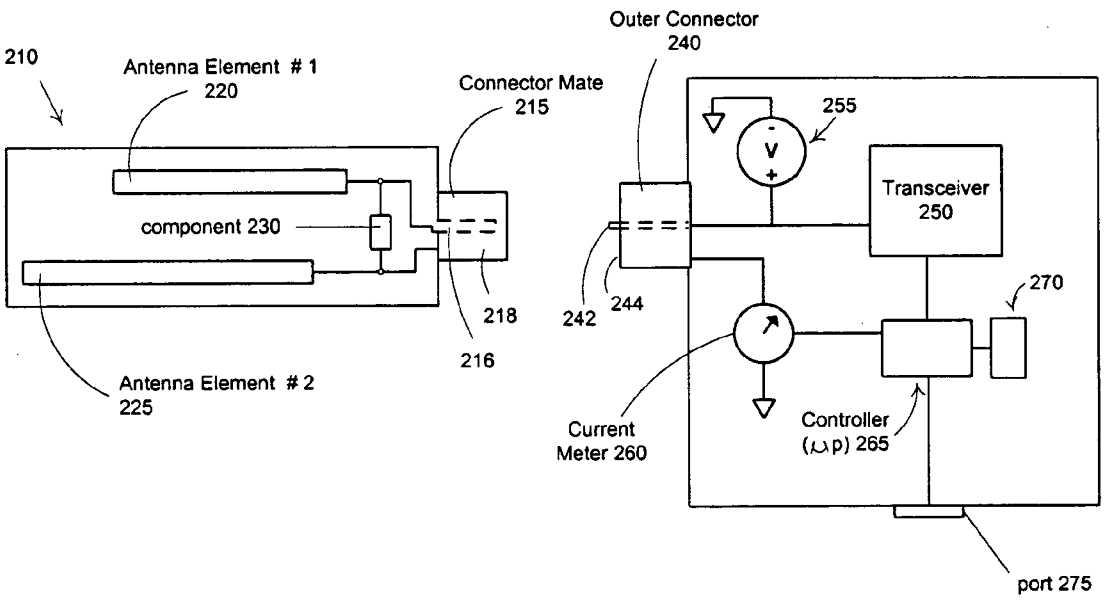
FIG. 2 is a block diagram of a transceiver board having antenna integrity checking devices and an antenna configured according to an embodiment of the present invention.

Referring again to the drawings, wherein like reference numerals designate identical or corresponding parts, and more particularly to FIG. 2 thereof, there is illustrated a block diagram of a transceiver board 200 having antenna integrity checking devices and an antenna 210 configured according to an embodiment of the present invention. The antenna 210 includes a connector mate 215 that provides connectivity between the antenna 210 and transceiver board 200. Thus, the antenna is connectorized and may be easily detached and replaced with a similar antenna, or an antenna having different gain or other properties.

In this embodiment (FIG. 2), the connector mate 215 is part of a co-axial connector. An inner portion 216 of the connector mate connects to antenna element #1 220, and an outer portion 218 of the connector mate connects to antenna element #2 225. A component 230 is attached across the inner portion 216 and outer portion 218. Preferably, the component 230 is a resistor having a value that can be correlated to a specific antenna type. In one embodiment, the resistor values are non-standard resistor values, thereby making replacement or changing of resistor values more difficult for someone trying to defeat the integrity check mechanisms. The component itself could be a non-standard value, or a combination of components could be used to derive a total non-standard resistance, capacitance, or other value. Table 1 provides an example set of resistor values correlated to specific antenna types:

TABLE 1

| Resistor | Antenna Type | Features |
|---|---|---|
| 900 ohm | 5.15–5.35 GHz, 1.5 dBi, 50 Ohm impedance | co-ax |
| 6k ohm | 5.15–5.35 GHz, 6 dBi, 50 Ohm impedance | dual element |
| 11k ohm | 5.725–5.825 GHz, 20 dBi, 50 Ohm | co-ax |
| 25k ohm | 5.725–5.825 GHz, 20 dBi, 75 Ohm | planar dual-element |
| >40k ohm | Invalid | — |

Connector mate 215 has a corresponding outer connector 240 attached to the transceiver board 200. An inner portion 242 and outer portion 244 of the connector 240 correspond and connect to portions 216 and 218 respectively of the connector mate 215 when the antenna 210 is installed to the transceiver board 200. The combination of outer connector 240 and connector mate 215 form a connector that passes transmitted and received signals to/from the antenna from/to the transceiver board. For transmissions, the inner portion connects to a transceiver 250 or other unit that provides a final signal to be communicated to the antenna 210 from the transceiver board. Signals received by the antenna and transmitted to the transceiver board also flow through the inner portions of the connector and connector mate to the transceiver for processing. Any number of configurations of transceivers, separate receiver and transmitter combinations, and connector types may be utilized.

A DC voltage source 255 produces a voltage that is directed to the inner portions of the connector. In one embodiment, the DC voltage source is a battery, or other stable power supply. The DC voltage appears across the component 230, creating a current that flows back to the transceiver board's ground through the outer portions of the connector and the current meter 260. The DC current flowing back into the transceiver board is detected by the current meter. The amount of current depends upon the electrical characteristics of component 230. The component electrical characteristics have been selected to identify the properties of antenna 210. If the properties of the antenna match the required characteristics of antennas permissible to be attached to the transceiver board, then the transceiver is allowed to transmit/receive signals. If the properties of the antenna 210 do not match properties of an antenna permissible for use with the transceiver board, then the transceiver is shut down.

In the context of the present invention, antenna properties includes properties of the antenna related to performance such as gain, frequency range, beam width etc., features of the antenna, such as mounting characteristics, connector types, cables, etc., and may also include any one or more of model number, serial number, or other code that identifies the antenna (including but not limited to any codes for identifying an antenna family, usage of the antenna, or applications of the antenna). In addition, in at least one embodiment, when determining antenna properties, the present invention includes determining that an antenna is connected as a property.

In one embodiment, the DC current is detected using a level detector that sends a signal directly to the transceiver if the DC current is within a specified range. Alternatively, as shown in FIG. 2, the DC current is detected by a measuring device (DC current meter 260), which then transmits the measured DC current to a controller device that evaluates the measured current flow to determine if the antenna is permissibly attached to the transceiver board. Regardless of how the component value is tested, if the test indicates a valid component value the controller device then allows the transceiver to operate. If the test indicates an invalid component, the controller shuts down the transceiver.

Measuring the DC current may be performed by a current meter device that identifies a range of current values. For example, the current is detected with a current sensor that has a high and low threshold detector on the transceiver board. The current sensor sends a signal to the controller indicating that the current value is within proper range (also indicating that the attached antenna is appropriate for the transceiver). Alternatively, a single comparator or a series of comparators may be utilized to determine discrete current levels, the current level being sent via a signal to the controller for evaluation.

In another embodiment, instead of an individual resistor or other component, the component 230 is constructed as a circuit with one or more inductors, capacitors, or other resonant devices. A resonant frequency of the component 230 is a value that identifies antenna properties. The controller or another device on the transceiver board measures the resonant frequencies to insure integrity or gather information about the attached antenna. In one embodiment, the component 230 is active, in that a power source is required to determine the resonant frequency. Alternatively, the resonant frequency is derived from passive components (not requiring any power source).

In one embodiment, the controller device is a set of electronics programmed to evaluate the measured DC current and shut down the transceiver if needed. In one embodiment, a single logic gate turns off a transmitter portion of the transceiver board if the measured DC current is outside a predetermined range. Preferably, the controller device is a microprocessor 265 that evaluates the DC current or receives signals indicating the current level or other characteristics of the component 230, and performs other tasks related to operation of the transceiver board. Memory device 270 contains programs for evaluation of the DC current and operation of the transceiver (including shutdown, restart, etc). Other measurable properties or features of the antenna 210 may also be used in evaluating (or verifying existence of an attached antenna) appropriateness of the antenna 210 for the transceiver board 200. The evaluation programs and other programs related to operation of transceiver board 200 are stored in memory 270 are executed by the microprocessor 265.

A transceiver board port 275 provide a port for transfer of new and updated programs for evaluating the DC current or other characteristics of the attached antenna. For example, Table 1 may be stored in a data portion of memory 270. The table may be updated with new values or changes to existing resistors or corresponding antennas. New and updated values are transferred to the memory via transceiver board port 275.

Figure 3:
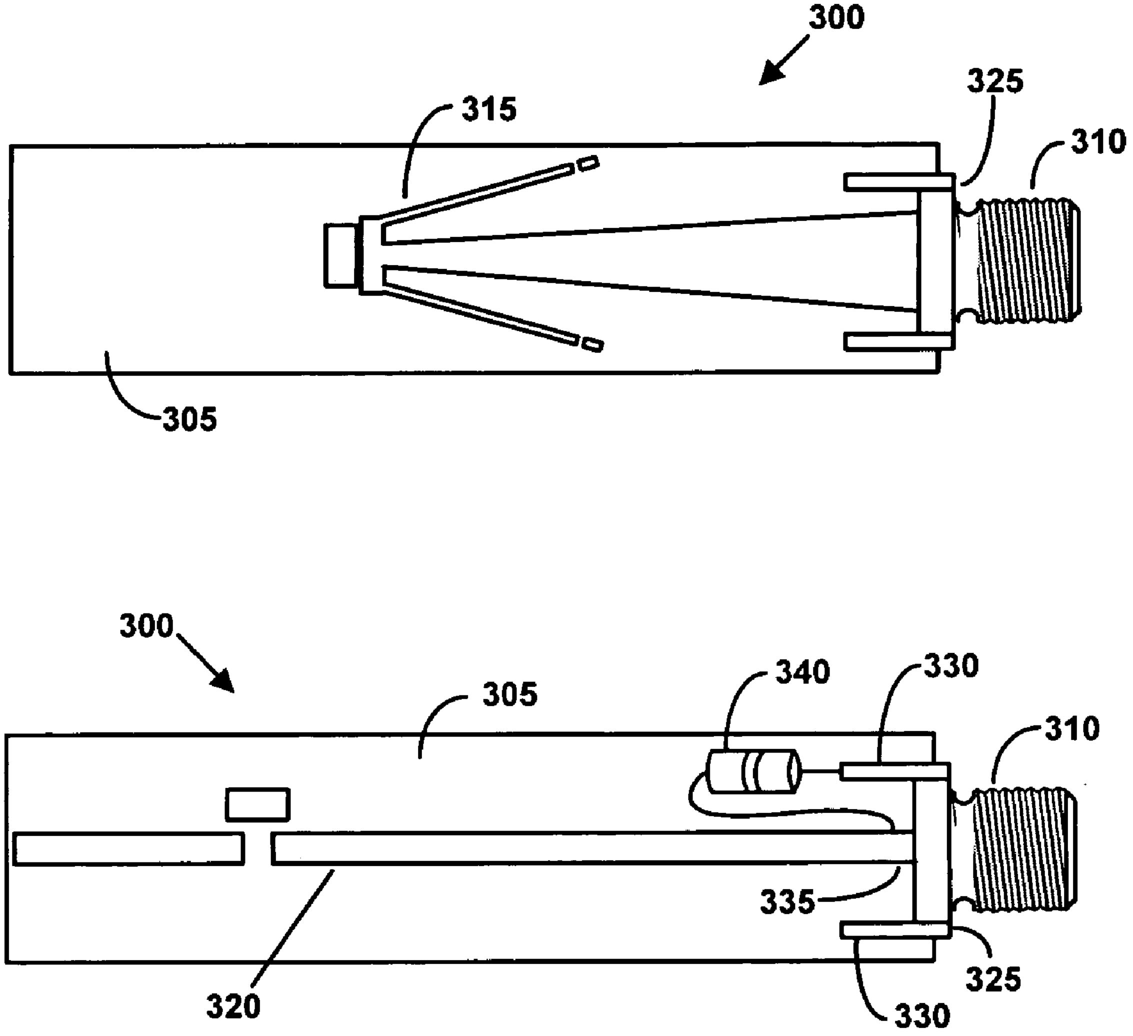
FIG. 3 is an illustration of an embodiment of the present invention.

FIG. 3 is an illustration of an antenna 300 constructed according to an embodiment of the present invention. The antenna 300 includes a connector mate 310, and antenna elements 315 and 320. Antenna element 315 is connected to an outer portion of the connector mate 310, and antenna element 320 is connected to an inner portion of connector mate 310. A substrate 305 separates antenna element 315 from antenna element 320. Base 325 is connected to the outer portion of connector mate 310 and is also connected to outer portion extensions 330 that protrude from the base. The inner portion of the connector mate is connected to inner portion protrusion 325.

A component 340 is connected between outer portion protrusion 330 and inner portion protrusion 325. In this embodiment, the component is a resistor selected for specific electrical characteristics identifying characteristics of the antenna 300. In other embodiments, the component is another electrical component or a combination of components.

In another embodiment, a multi-pin connector is used and the pins are subjected to a specific combination of either shorts, grounds, or electrical charges (the shorts could be between pins or to ground) . The transmitter (or controller on the transmitter/receiver board) then checks that the correct pins are shorted. The check may be as simple as verifying a specific pattern of shorts, grounds, or electrical charges. Alternatively, a range of correctly shorted pins could be valid. Also, in another embodiment, the pattern of shorts is used to encode an amount of gain or other information pertinent to the antenna.

Figure 4:
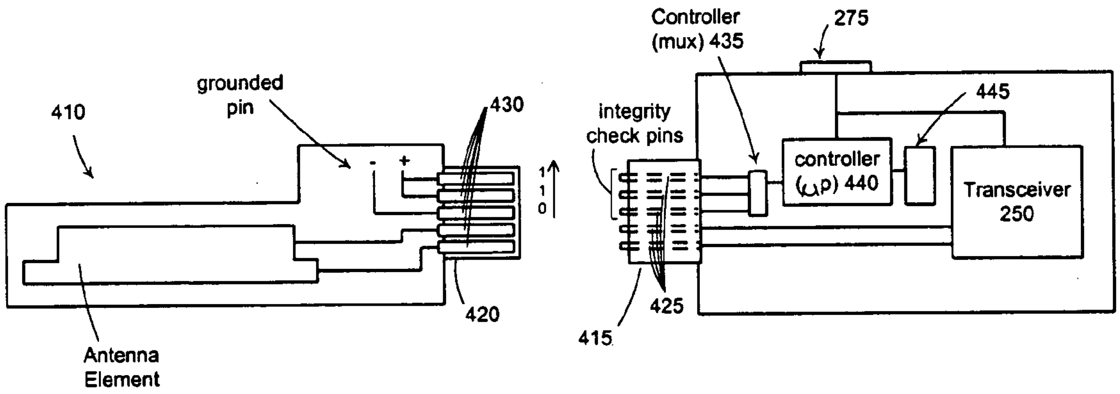
FIG. 4 is a block diagram of an example pin grounding embodiment of the present invention.

FIG. 4 is a block diagram of an example pin grounding embodiment of the present invention. A pin detecting transceiver board 400 and pin grounded antenna 410 are illustrated. The antenna and transceiver are connected via a connector comprising a pinned outer connector 415 and a pinned connector mate 420. An inner portion of the pinned outer connector is a set of pins 425 to correspond and contact with pin receivers 430 in the connector mate. Again, any number of different connector may be utilized. Preferably, the connectors connecting the transceiver signals are shielded.

A set of the pin receivers are either grounded or subjected to voltage. A grounded pin receiver is referred to as a grounded pin. Alternatively, the pins subjected to voltage may be left floating (not grounded). Grounding or powering of the set of pin receivers duplicates a code corresponding to the type or characteristics of the antenna. The set of pin receivers (when either grounded or subjected to a voltage/floating) transmit an identification signal to integrity check pins of the pin detecting transceiver board. The identification signal is received and evaluated by the pin detecting transceiver board, and the transceiver is either allowed to operate, shutdown, or the operating characteristics of the transceiver itself is modified as appropriate depending on the type of antenna that is attached. If the antenna matches the operating characteristics of the transceiver board, the transceiver is allowed to operate. If the antenna is not the best match, but transceiver can operate safely and within specs at a reduced output level, programming of the transceiver board may allow operation of the transceiver at that reduced output level even though the antenna might not be the best match. If the transceiver cannot operate safely or according to regulations because of the antenna is improperly matched, the transceiver is shutdown.

Table 2 provides an example encoding scheme for a 3 integrity pin implementation of this embodiment (FIG. 4).

TABLE 2

| Code | Antenna |
|---|---|
| 000 | Invalid |
| 001 | 5.15–5.35 GHz, 1.5 dBi, 50 Ohm impedance |
| 010 | Invalid |
| 011 | 5.15–5.35 GHz, 6 dBi, 50 Ohm impedance |

TABLE 2-continued

| Code | Antenna |
|---|---|
| 100 | 5.725–5.825 GHz, 20 dBi, 50 Ohm |
| 101 | 5.725–5.825 GHz, 20 dBi, 75 Ohm |
| 110 | Invalid |
| 111 | Invalid |

As seen in FIG. 4, the upper 3 pins of the pin set 425 are integrity check pins, and the corresponding upper 3 pin receivers provide the grounded or powered portions of the signal. Here, the first pin (lowest of the upper 3 set) is a grounded pin connected to (−). The second and third pins are each powered (connected to (+)). The resulting code is 011, which according to table 2, corresponds to a 5.15–5.35 GHz antenna with gain of 1.5 dBi and 50 Ohm input impedance. Therefore, so long as the transceiver board is capable of operating safely and within regulations, the transceiver board will be allowed to operate with antenna 410 attached.

The code provided to the integrity check pins is transmitted to a collector (e.g., mux 435) that then transmits the code to controller 440. In one alternative, the code is transmitted directly to the controller. The controller 440 is a set of electronics or a microprocessor programmed to evaluate the code and then either shut or modify operation of the transceiver 250. As in the previous embodiment, memory 445 contains programs and data (including table 2) needed for operation of the controller 440.

The resistor values and antenna types provided in Table 1 and the codes and antenna types provided in Table 2 are examples directed to larger classes or generic varieties of antennas (omni, bluetooth, etc.). Those examples indicate that an appropriate antenna of the proper class from one manufacturer may be used on another manufacturer's wireless device, if the proper encoding, keys (e.g., challenge response mechanisms), or resistance values are present. However, the present invention may also be applied to specific antenna products developed by a single manufacturer without necessarily having any relevance to the broader antenna categories. For example, a manufacturer of a wireless device may encode its antennas such that they match specific devices rather than a category of devices. In this example, manufacturers would determine their own antenna types and characteristics/keys/encoding schemes and make products that deter and ensure operation with only their own acceptable antennas. Furthermore, all antennas from a manufacturer (or vendor) will not necessarily be acceptable with each of the same manufacturers wireless devices. In one embodiment, vendors will have a set (but expandable list) of antennas specific to each wireless device (e.g. a PCI card with 1.6 dBi wall mount antenna (made by same manufacturer), a 1.6 dBi desktop antenna, a 5.2 dbi omni ceiling mount). Table 3 provides an example multiple list of a generic manufacturer's antenna options:

TABLE 3

| ABC Manufacturer Product List | | | | | |
|---|---|---|---|---|---|
| Product | ANT-1 | ANT-2 | ANT-3 | ANT-4 | ANT-5 |
| Description | Diversity omni-directional ceiling mount | Diver-sity patch wall mount | Omni-directional ceiling mount | High gain omni-directional ceiling mount | Omni-directional ground plane |
| Application | Indoor unobtrusive antenna, Excellent throughput & coverage solution in high multipath cells. | Indoor, unobtrusive medium range antenna | Indoor medium-range antenna, typically hung from crossbars of drop ceilings | Flat, circular, medium-range indoor antenna | long-range antenna (may also be used as a medium-range bridge antenna) |
| Gain | 6.5 dBi with two radiating elements | 5.2 dBi | 5.2 dBi | 3 dBi | 9 dBi |
| Approx. Indoor Range | 350 ft. (105 m) | 547 ft. (167 m) | 350 ft (107 m) | 497 ft (151 m) | 497 ft (151 m) |
| Beam Width | 360° H 80° V | 80° H 55° V | 360° H 75° V | 60° H 60° V | 75° H 65° V |
| Encoding | R 251 ohms | Code 011 | Code 010 | Key | Challenge/Response |

In Table 3, several antenna products are shown. Each antenna product has various specifications and at least one encoding scheme (resistance, pin pattern, challenge response, encrypted key, etc.). In one embodiment, combinations of encoding schemes are utilized (e.g., resistance and a code, or other combinations). Each of the antennas are intended to work with one wireless device or a limited set of wireless devices from only the ABC manufacturer. Although Table 4 is a product list, the encoding scheme(s) and specifications of resistance values, codes, etc. would not be published or available to the general public.

Figure 5:
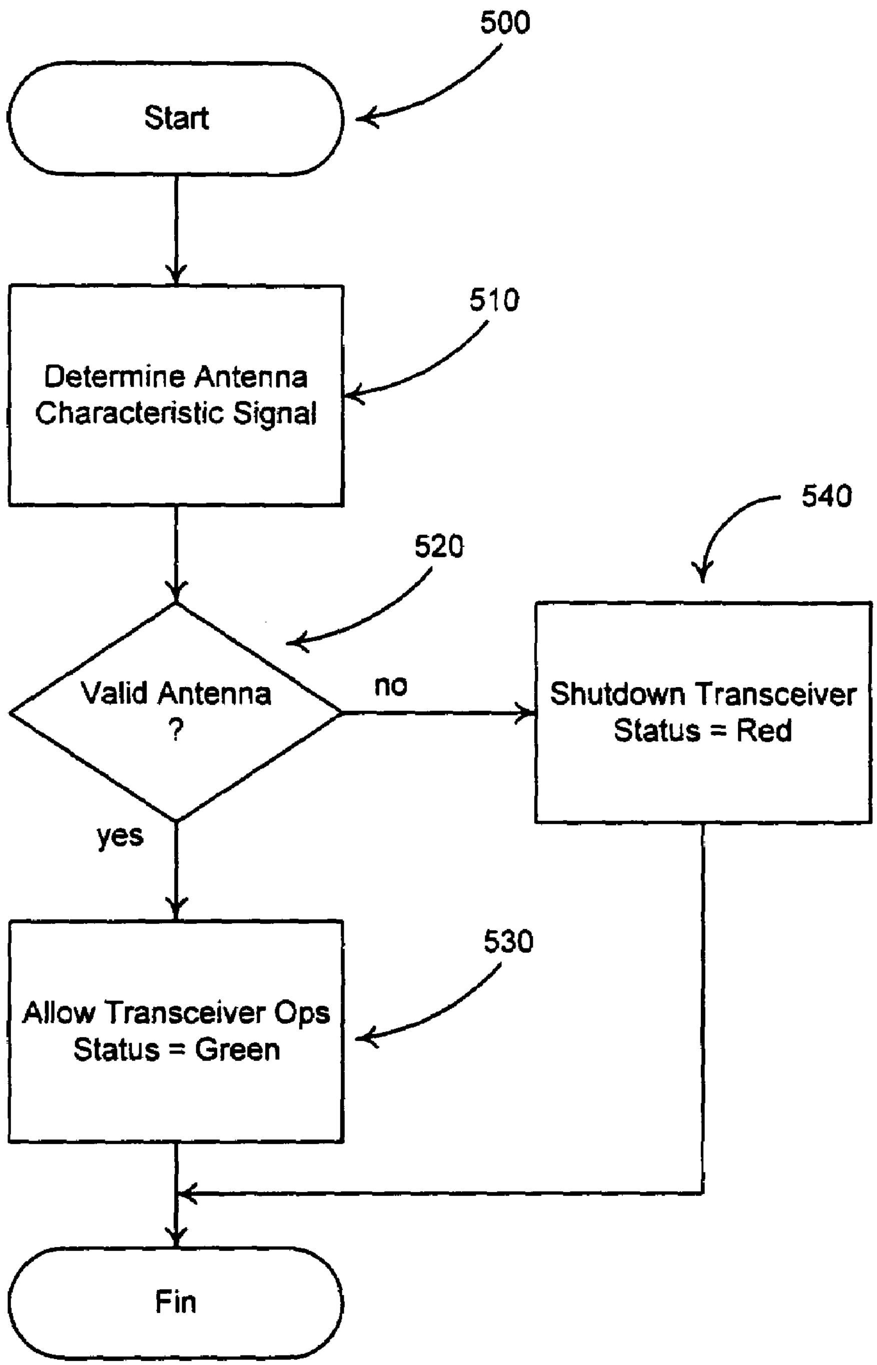
FIG. 5 is a flow chart illustrating an example process consistent with an embodiment of the present invention.

FIG. 5 is a flow chart illustrating an example process consistent with an embodiment of the present invention. At step 500, an antenna is installed, or a unit (e.g., transceiver board 400 is powered up for operation. At step 510, the transceiver board determines a signal indicating characteristics of an antenna attached to the transceiver board. In one embodiment, the transceiver board receives a signal that is generated on the antenna, or, as discussed above, the transceiver board supplies DC power to the antenna and measures a resulting current that flows through the board, allowing measurement of electrical properties identifying the antennas characteristics. In yet another alternative, a challenge response mechanism is provided. Other methods of determining a signal (characteristic signal) that identifies antenna characteristics (or properties) may be employed.

Next, at step 520, it is determined whether the antenna is valid for the particular transceiver board to which the antenna is attached. In one embodiment, the characteristic signal is compared against a range of signals that are valid for the transceiver board.

In another embodiment, a value contained in the characteristic signal is used to reference a table of antennas maintained on the transceiver board. Each antenna either being valid or invalid. In another embodiment, antennas may be noted as being valid only if operational parameters of the transceiver (e.g., output power) can be maintained within certain limits. For example, a high gain antenna may not be permissible under FCC regulations because its range is too far and would interfere with other similar RF systems. However, the range can be maintained within specifications if the power output from the transmitter portion of the transceiver board is reduced by 50%. Therefore, if the transceiver board's output power can be automatically reduced by 50% as long as the high gain antenna is installed, then the high gain antenna would be considered valid. Facilities for adjusting the transceiver's operational parameters could be maintained in the controller 440, embodied in either electronics or in software programs stored in memory 445, for example. If the facilities to automatically reduce power output by 50% is not available, then the high gain antenna would be considered invalid.

If the antenna is determined to be invalid, then the transceiver is shutdown. In one embodiment, an indicating light is lighted (e.g., red color light) indicating that the attached antenna is invalid and the transceiver board will not operate. The indicating light may be mounted on the antenna to more fully identify the antenna as causing the non-operational status. In one embodiment, the entire transceiver board is turned off or set to a non-operational status. Alternatively, only the transmitter portion of the transceiver board is shutdown, allowing the transceiver board to still receive and process received signals broadcast from other units.

If the antenna is determined to be valid, then, the transceiver board is power up or maintained in a fully operational state. If the transceiver board has facilities to adjust the transceiver's operational parameters and the antenna requires adjustment, the controller (or other electronics on the transceiver board) adjusts the transceivers operational parameters, and, again, the transceiver board is placed in a fully operational state. The status indicating light is lighted in a manner that indicates the fully operational mode (green). If the transceivers parameters were adjusted, the status light may indicate the adjusted state by being lighted in an alternate color (yellow) or pattern (flashing green). Many other combinations of lights, colors or patterns may be used to indicate the various possible transceiver states. Depending on the particular implementation, the entire process of determining the antenna characteristics and maintaining operational status (or shutting down the transceiver may be repeated, performed at intervals, or only performed at startup.

In another embodiment, an active circuit is placed in the antenna unit. The active circuit may be powered via DC voltage placed on one of the pins (e.g., DC voltage on any of pins 425/430). Other pins (or the same pin) could be used to signal to the active circuit. If the active circuit were analog, information could be coded in its input impedance, such as gain, non-linearity, frequency response, or oscillation frequency. If the active circuit were digital, any number of integrity algorithms that are known to those skilled in the art could be used. For example, the transmitter could send a "challenge" signal. The circuit in the antenna would manipulate the challenge to produce and then send a response. The transmitter could then check that the response is correct since the transmitter would know the manipulation that valid the antennas should be using. Such an integrity system is difficult to break as the response would be highly encrypted. The active circuit could also communicate antenna information such as the gain of the antenna.

Active circuitry can be used even if the connector has only a single signal pin and a ground pin. The single signal pin is used in three frequency bands: DC power is supplied in baseband, digital signaling can be sent in an intermediate frequency band, and the signal itself can be sent in a high radio frequency band. The digital signal can be modulated carefully to insure that it has frequency components only within the intermediate frequency range.

Figure 6:
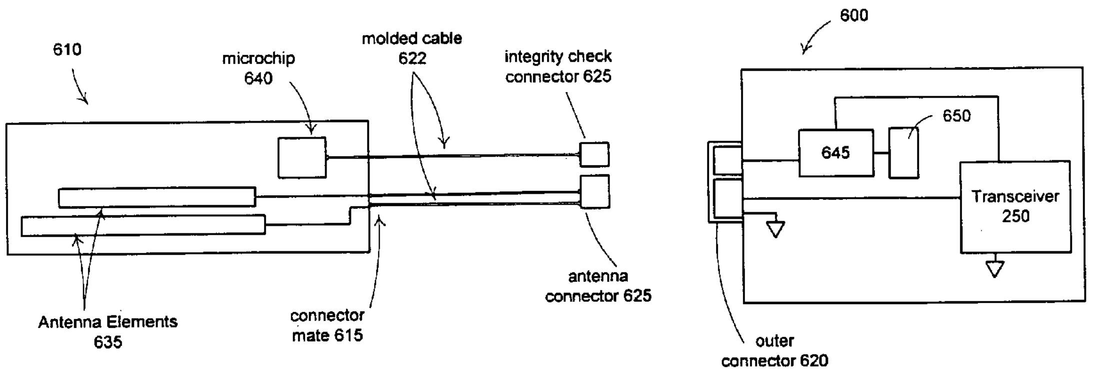
FIG. 6 is a block diagram of an embedded microchip embodiment of the present invention.

FIG. 6 is a block diagram of an embedded microchip embodiment of the present invention. Transceiver board 600 connects to antenna 610 via a connector comprising connector mate 615 and outer connector 620. The connector mate 615 includes and integrity check connector 625 and antenna connector 630. In one alternative, the integrity check connector and antenna connector are combined into a single connecting component. The antenna connector connects the output/input of the transceiver 250 to antenna elements 635. The integrity check connector connects microchip 640 to controller 645.

The controller 640 may be implemented as a an ASIC or a general purpose microprocessor running program embedded within the microprocessor or stored in memory element 650. Programs executed by the ASIC or microprocessor check the integrity of antenna 610. Integrity of the antenna includes determining that an antenna is connected, and determining operational characteristics/properties of the connected antenna.

Generally, the connectors between the antenna and transceiver board are mounted on each of the boards as illustrated in FIGS. 2–4. However, in an alternate embodiment, the antenna may include a length of cable between the antenna element and the antenna connector. For example, a molded cable 622 has conduits attached to each of microchip 640, and antenna elements 635. In this embodiment, preferably, the cabling is permanently affixed to the antenna. The cabling enhances ability for the antenna to be placed in a proper (or more convenient) location. For example, a desktop PC on the floor having a wireless PCI card coupled to an external antenna with 6 feet of cable. The cabling length allows the external antenna to be mounted higher up and/or away from the rest of the computer (or other equipment) which may interfere with transmission/reception (e.g., affixed on a cubical or office wall).

Microchip 640 includes information or codes that identify the operational characteristics/properties of the antenna 610. The characteristics/properties may be sent to the controller 645 upon a get or other request issued by the controller to the microchip. Alternatively, a challenge/response system may be implemented where a challenge is issued by the controller 645 and the microchip must provide an appropriate response. The appropriate response would be a message encoded according to the challenge that also identifies the antenna characteristics/properties. Any number of challenge/response or other security protocols may be implemented as will be appreciated by the ordinary practitioner based on the present disclosure. Table 4 provides an example set of Program Design Code for implementing an integrity check according to an embodiment of the present invention. The Program Design Code is not intended to be a compilable or executable set of instructions, but is provided as an example programming structure that implements various features of the present invention.

TABLE 4

```
Send (Challenge_Code); /* integrity check pins */
Delay (X);            /* wait Xms for response */
Get (Response);
Decoded_Resp = Decode (Response, challenge code);
Properties = Index Table (Decoded_Response);
Compare antenna Properties to Transceiver Board
Requirements and FCC Regulations;
if comparison unfavorable =>
    disable transmitter portion
    set status red
else =>
    configure transmitter according to antenna
    set status green/yellow
end if
```

Figure 7:
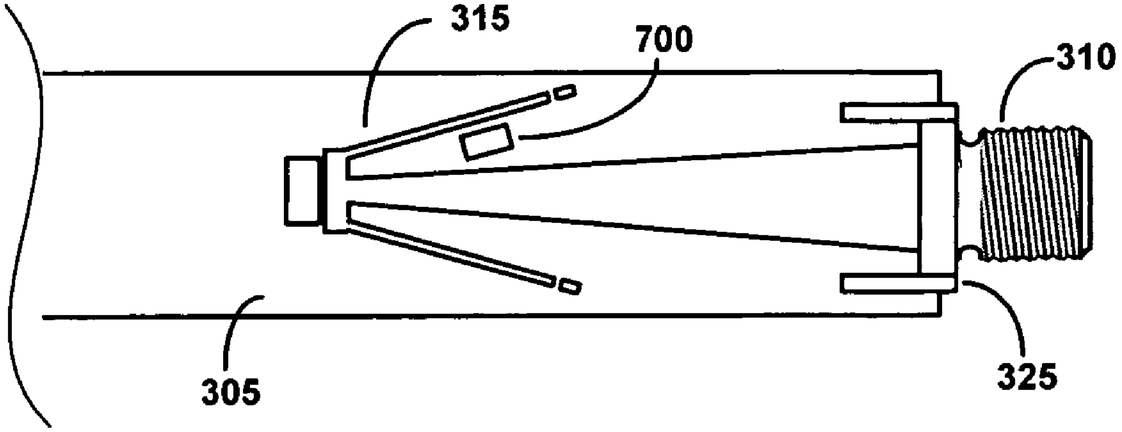
FIG. 7 is a drawing illustrating example placement of a component or microchip in accordance with another embodiment of the present invention.

The present invention is also directed toward reducing the likelihood that entrepreneurial users of devices according to the present invention do not thwart the security implemented for validating antenna integrity. In this regard, the present invention also provides for placement of components or microchips resident on the antennas in a location that is not easily altered, removed, or otherwise modified. The problem may be noted, for example, in FIG. 3, where component resistor 340 is located on a surface of a substrate 305 that also holds the antenna elements 320 and 315. In realization of this problem, the present invention includes embedding the component or microchip within the substrate backing the antenna device. In another embodiment, the component of microchip is placed between antenna elements or other components on the antenna. For example, FIG. 7 is a drawing illustrating example placement of a component or microchip 700 that is place within the boundaries of antenna element 315. Traces or other wires (not shown) connecting the component or microchip 700 to appropriate connections of the connector mate 310 may be embedded in the substrate. Preferably, both the component or microchip 700 and the wires are embedded within the substrate. Embedding the integrity check components in the substrate produces a mechanically robust enclosure/shield which helps prevent defeat of protection provided by the integrity check components by making it more difficult to cut or dissemble the antenna/connector assembly and modify or replace any parts or components.

Although the present invention has been described herein mainly with reference to a transceiver board, it should be apparent that the same circuits, connections, illustrative diagrams, program flows and programming structures presented herein may be applied to other devices, particularly transmitters, receivers, repeaters, and other broadcast devices whether provided as stand alone units. The following paragraphs provide several non-limiting examples where the invention may be applied.

The present invention is also particularly well suited for wireless LAN (WLAN) solutions based on the IEEE 802.11a 5 GHz standard. For example, combining the present invention with a 5 GHz "Radio-on-a-Chip" (RoC) such as the Atheros AR5000. The RoC then delivers cost-effective, robust connectivity at high data rates while also insuring antenna integrity.

Antenna integrity in the 5 GHz frequency space is particularly important because of the large expansion now being experienced in current devices and large expected growth in next generation devices. The IEEE 802.11a standard specifies data rates up to 54 Mbps, and the present invention maintains existing reliable connectivity and promotes compliance to manufacturer established and FCC antenna and broadcast requirements. Thus, products based on the AR5000 or other wireless solutions, combined with the present invention, furnish an ideal drop-in solution for wireless networking in businesses, homes and public areas or 'hot-spots' such as airports and hotels.

The present invention is also compatible with other modes of operation. For example, the AR5000 chipset supports all IEEE 802.11a standard data rates up to 54 Mbps as well as extended rates up to 72 Mbps in Atheros Turbo Mode™. In addition, the broad spectrum allocation at 5 GHz allows for more non-overlapping channels and less co-channel interference which is further enhanced by including antenna integrity measures consistent with the present invention. The combination of high speeds and additional channels results in increased WLAN system capacity to support many users and a wide variety of high bandwidth applications. Utilization of the present invention to insure that a proper antenna is used for operation of devices transmitting at these data rates increases reliability of other devices operating in the same spectrum.

The present invention is ideally suited to be applied in Quality of Service (QoS) type broadcasts for real-time multimedia applications. This allows multiple video, audio, voice, data and telephony applications to coexist on the same radio channel. The present invention allows programmability of the integrity check mechanisms (e.g., programs stored in memory 270) so that new antenna features, types gain ranges, or other parameters can be upgraded or changed (e.g., via port 275) consistent with future requirements within the QoS and other product spaces.

Clearly, the present invention may be utilized to insure antennas are well matched for various broadcast and/or modulation formats. For some applications, OFDM Modulation is used to Boost Range and Reliability. OFDM mitigates multi-path inter-symbol interference at high data rates by simultaneously transmitting multiple sub-carriers on orthogonal frequencies. Because this approach is tolerant of many common channel impairments and severe multi-path, OFDM improves range and reliability, making it the ideal choice for supporting multiple high-bandwidth tasks. Antenna selection playing an important role for these tasks, the present invention is therefore clearly applicable.

Although the present invention may be utilized in many devices types, the invention has clear advantages for wireless networking and other wireless applications including, but not limited to any of PCI, Mini PCI and CardBus clients for desktops and laptops; large and small enterprise access points; access points for 'hot-spots' or public-area LANs in locations such as airports and hotels; home residential gateways to support devices such as set-top boxes and game consoles; consumer electronic devices for video, audio, and telephony; high-speed wireless bridging between buildings; embedded devices such as POS terminals and bar code scanners; telematics applications such as vehicular data and fleet management; Palm O/S devices, Pocket PC, and other handheld computers, personal data assistants, etc.; and others.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, reading electronic component values, including at least any of resistance, capacitance, inductance, and/or resonant frequencies; comparing component values to ranges of valid values; looking up antenna properties in a database; setting operational/non-operational status of a transceiver board (or any portions of the transceiver board); adjusting transmitter and/or receiver characteristics (including transmitter power) based on antenna properties; setting operation lights or other indicators (including status messages) of the operational status of the transceiver which includes display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed and desired to be secure by Letters Patent of the United States is:

1. An antenna, comprising:

an RF input pin;

at least one antenna element connected to the RF input pin; and at least one electronic component connected to the RF input pin, said electronic component having a value that identifies at least one property of the antenna.

2. The antenna according to claim 1, wherein said at least one electronic component is a resistor having a value related to said at least one property of the antenna.

3. The antenna according to claim 1, wherein said at least one electronic component is a circuit having a resonant frequency related to said at least one property of the antenna.

4. The antenna according to claim 1, wherein said at least one electronic component is a microchip configured to transmit a value related to antenna properties via the RF input pin.

5. The antenna according to claim 1, wherein said at least one electronic component is a microchip configured to send a challenge response in response to a challenge, said challenge response including a value related to said at least one property of the antenna.

6. The antenna according to claim 1, wherein said at least one electronic component is located in a location that it cannot be easily removed or modified.

7. The antenna according to claim 1, wherein said at least one electronic component is substantially surrounded by said at least one antenna element.

8. The antenna according to claim 1, wherein said at least one electronic component is embedded within a substrate holding said at least one antenna element.

9. The antenna according to claim 8, wherein said at least one electronic component is substantially surrounded by said at least one antenna element.

10. The antenna according to claim 1, further comprising:

a ground pin;

wherein:

said at least one antenna element comprises a first antenna element connected to said RF input pin and a second antenna element connected to said ground pin; and said at least one electronic component is connected between said RF pin and said ground pin.

11. The antenna according to claim 10, further comprising:

a substrate having first and second surfaces, the first antenna element disposed on the first surface and the second antenna element is disposed on the second surface.

12. The antenna according to claim 11, wherein said at least one electronic component is disposed between the first antenna element and the second antenna element and within said substrate.

13. The antenna according to claim 10, wherein said antenna is a 5 GHz connectorized antenna.

14. The antenna according to claim 1, wherein said antenna is a dual element planar antenna.

15. The antenna comprising:

a set of data pins and an RF input pin;

at least one antenna element connected to the RF input pin; and a series of shorts and opens connected to a set of data pins;

wherein said antenna is a dual element planar antenna.

16. An antenna, comprising:

a set of input pins and an RF input pin;

at least one antenna element connected to the RF input pin; and at least one electronic component connected to the set of input pins;

wherein said at least one electronic component has a value related to at least one property of the antenna.

17. The antenna according to claim 16, wherein said electronic component is a microchip configured to transmit at least a value related to at least one property of the antenna.

18. The antenna according to claim 16, wherein said at least one electronic component is a circuit having a resonant frequency that identifies at least one property of the antenna.

19. The antenna according to claim 16, wherein said at least one electronic component is a resistor having a resistance value that identifies at least one property of the antenna.

20. The antenna according to claim 16, wherein said at least one electronic component is an active circuit powered from a source connected to one of the input pins.

21. The antenna according to claim 16, wherein said antenna is a dual element planar antenna.

22. A method comprising the steps of:

preparing a substrate;

disposing at least one antenna element on the substrate;

attaching a connector to said at least one antenna element; and inserting at least one electronic component on the substrate in a location where it is not easily removed or modified;

wherein said location is surrounded by said at least one antenna element.

23. A method comprising the steps of:

preparing a substrate;

disposing at least one antenna element on the substrate;

attaching a connector to said at least one antenna element; and inserting at least one electronic component on the substrate in a location where it is not easily removed or modified;

wherein said electronic component is one of a resistor having a value selected to identify properties of the antenna, an resonant circuit having a resonant frequency that identifies properties of the antenna, and a microchip configured to transmit properties of the antenna.

24. A method comprising the steps of:

preparing a substrate;

disposing at least one antenna element on the substrate;

attaching a connector to said at least one antenna element; and inserting at least one electronic component on the substrate in a location where it is not easily removed or modified;

wherein said antenna is a dual element planar antenna.

25. A method of manufacturing an antenna, comprising the steps of:

disposing at least one antenna element on a substrate;

attaching a connector to said at least one antenna element; and inserting at least one electronic component on the substrate;

wherein the electronic component has a value related to at least one property of the antenna.

26. The method according to claim 25, wherein said antenna is a dual element planar antenna.

27. The method according to claim 25, wherein the location is surrounded by said at least one antenna element.

28. A method of manufacturing an antenna, comprising the steps of:

disposing at least one antenna element on a substrate;

attaching a connector to said at least one antenna element;

and inserting at least one electronic component on the substrate;

wherein the electronic component is configured to identify at least one property of the antenna.

29. The method according to claim 28, wherein the location is embedded in the substrate.

30. The method according to claim 28, wherein:

the antenna comprises, a set of data pins and an RF input pin, at least one antenna element connected to the RF input pin, and a series of shorts and opens connected to a set of data pins.

31. The method according to claim 30, wherein said shorts comprise grounded pins and said opens comprise pins which are not grounded.

32. The method according to claim 30, wherein said shorts comprise grounded pins and said opens comprise pins connected to a voltage source.

* * * * *